(12) United States Patent
Syrjärinne (10) Patent No.: US 6,535,833 B1
(45) Date of Patent: Mar. 18, 2003

(54) METHOD AND APPARATUS FOR FILTERING MEASUREMENTS USED IN A GENERALIZED POSITIONING SYSTEM

(75) Inventor: Jari Syrjärinne, Tampere (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/444,880

(22) Filed: Nov. 22, 1999

(51) Int. Cl.$^7$ ............................................... G01C 17/38
(52) U.S. Cl. ..................................... 702/150; 702/152
(58) Field of Search ......................... 342/357.09, 357, 342/357.04, 357.03; 324/326; 701/215, 214, 216; 379/59, 60; 455/31.1, 426, 456

(56) References Cited

U.S. PATENT DOCUMENTS

| | | | | |
|---|---|---|---|---|
| 4,535,625 A | * | 8/1985 | Lyle, Jr. ...................... | 73/152 |
| 5,381,095 A | * | 1/1995 | Andrews .................... | 324/326 |
| 5,390,133 A | * | 2/1995 | Sohie ......................... | 364/516 |
| 5,600,706 A | * | 2/1997 | Dunn et al. .................. | 379/59 |
| 5,602,903 A | * | 2/1997 | LeBlanc et al. .............. | 379/60 |
| 5,768,686 A | * | 6/1998 | LeBlance et al. .......... | 455/31.1 |
| 5,883,595 A | * | 3/1999 | Colley ........................ | 342/357 |
| 5,890,068 A | | 3/1999 | Fattouche et al. | |
| 5,960,341 A | * | 9/1999 | LeBlanc et al. ............ | 455/426 |
| 6,127,968 A | * | 10/2000 | Lu .......................... | 342/357.03 |
| 6,167,347 A | * | 12/2000 | Lin ............................ | 701/214 |
| 6,205,400 B1 | * | 3/2001 | Lin ............................ | 701/214 |
| 6,240,367 B1 | * | 5/2001 | Lin ............................ | 701/214 |
| 6,246,960 B1 | * | 6/2001 | Lin ............................ | 701/214 |
| 6,263,281 B1 | * | 7/2001 | Yamamoto et al. ......... | 701/215 |
| 6,266,533 B1 | * | 7/2001 | Zadeh et al. ................ | 455/456 |
| 6,268,824 B1 | * | 7/2001 | Zhodzishky et al. ... | 342/357.04 |
| 6,278,945 B1 | * | 8/2001 | Lin ............................ | 701/216 |
| 6,285,315 B1 | * | 9/2001 | Pratt ........................ | 342/357.09 |
| 6,292,750 B1 | * | 9/2001 | Lin ............................ | 701/214 |

OTHER PUBLICATIONS

Mirabadi, A; Mort, N; Schimid, F; "Fault Detection And Isolation In Multisensor Train Navigation Systems"; UKACC International Conference On Control; Conference Publication No. 455; vol. 2; pp. 969–974; 1998.*

Chin, L; "Application Of Neural Nteworks Aided Target Tracking"; IEEE International Conference On Neual Networks; vol. 3; pp. 1634–1639; 1996.*

Yaakov Bar–Shalow (1995) "Multitarget–Multisensor Tracking Principles and Techniques", NMP Research and Technology.*

Welch, Greg, and Gary Bishop (1995). "An Introduction to the Kalman Filter," University of North Carolina at Chapel Hill, Department of Computer Science, Chapel Hill, NC, USA. TR95–041.*

"Multiiarget—Multisensor Tracking Principles and Techniques," Y. Bar–Shalon pp. 1, 46 and 20, 1995.

"An Introduction to the Kalman Filter," Welch et al., pp. 1–16, Sep. 17, 1997.

* cited by examiner

Primary Examiner—John Barlow
Assistant Examiner—Douglas N Washburn
(74) Attorney, Agent, or Firm—Ware, Fressola, Van Der Sluys & Adolphson LLP (57) ABSTRACT

A positioning system based on an extended Kalman filter (EKF), or other filter, responsive to measurements provided on the basis of information received from, in some applications, cellular base stations, as well as, optionally, satellites, where, in the case of measurements by satellites, and also in other aspects of the invention as used with cellular positioning data, the EKF is modified for greater responsiveness based on use of calculated association probabilities for each measurement in a set of measurements of position at a particular instant of time, the association probabilities used in the calculation of a combined measurement innovation (residual) used in calculating the next estimate of position (and other state information, including velocity). By using a combined measurement innovation, the positioning system is able to accept simultaneous measurements based on information received from different sources of information, including both satellites and cellular base stations.

46 Claims, 5 Drawing Sheets

METHOD AND APPARATUS FOR FILTERING MEASUREMENTS USED IN A GENERALIZED POSITIONING SYSTEM

CROSS REFERENCE TO RELATED APPLICATION

Reference is made to co-filed U.S. application Ser. No. 09/443,259 entitled GENERALIZED POSITIONING SYSTEM BASED ON USE OF A STATISTICAL FILTER, filed on Nov. 22, 1999, with U.S. Express Mail No. EL 381 226 402 US.

Reference is also made to co-filed U.S. application Ser. No. 09/444,584 entitled MULTIPLE-MODEL NAVIGATION FILTER WITH HYBRID POSITIONING, filed on Nov. 2, 1999, with U.S. Express Mail No. EL 381 226 380 US.

FIELD OF THE INVENTION

The present invention relates generally to positioning systems. More particularly, the present invention pertains to the application of a filter, such as the extended Kalman filter, in such positioning systems, or in systems that provide estimates of one or another aspect besides position of the motion of an object, using information acquired from cellular base stations and from satellites.

BACKGROUND OF THE INVENTION

A satellite positioning system (SATPS) receiver generally determines its positions by triangulating its Line of Sight (LOS) range to several satellites or space vehicles. A GPS receiver, for example, computes a 4-dimensional solution involving latitude, longitude, altitude, and time using the LOS ranges to as few as four satellites. The accuracy of the solution is a direct function of the accuracy of the range measurements.

SATPS receivers are growing rapidly in popularity and application. GPS receivers, for example, are now common in aviation, marine, and terrestrial applications. An increasingly common terrestrial application for GPS receivers is in automobiles. In the automotive context, the vehicle's location is typically displayed on an electronic display of a street map. It is vital in this context, therefore, to provide the driver with continuously updated position solutions, collectively called a "ground track," that accurately track the vehicle's movement from one moment to the next. Experience shows that consumers consider ground-track fidelity as one of the most important criteria in choosing a receiver. It is extremely important, therefore, that the ground-track displayed on the GPS receiver's electronic map not have spurious jumps, stair steps, spikes, jigs, or jogs that are unrelated to the vehicle's actual path.

There are a number of factors, however, that may cause discontinuities in the position solutions used to determine the ground-track of an automotive SATPS receiver. One source of position solution discontinuity is "Selective Availability" (SA), which restricts the accuracy of civilian GPS receivers to roughly 100 meters. SA is intentionally used by the U.S. Government for purposes of national security. The Department of Defense (DOD) implements SA by purposely injecting error into the satellite range signals.

Another common source of position solution discontinuity is due to the phenomenon known as multi-path, where the true LOS signal from a given satellite reaches the GPS receiver's antenna, along with additional signals providing supposedly the same information, the additional signals caused by reflection from nearby objects, such as buildings or cliffs. The multi-path phenomenon is particularly troublesome for automotive receivers because they are frequently used in cities and surrounded by tall buildings. This environment is sometimes called an "urban canyon" due to the canyon-like setting it resembles. Regardless of source, multi-path can be a very vexing problem because the additional signals may be very strong, but very wrong.

Yet another source of position solution discontinuity is that the constellation of satellites used by a SATPS receiver can change; the SATPS receiver may see a different constellation of satellites from one moment to the next. If the GPS receiver is located in an urban canyon environment, for example, individual satellites may become blocked and later unblocked as the receiver moves past different buildings. The discontinuity arises in this situation because the error in a position solution is based on the constellation of satellites used. (Two satellites located in approximately the same direction will provide position information with larger error than two satellites in very different directions, all other things being equal.) If the position solution provided by a GPS receiver is suddenly based on a different constellation, the different error may cause a jump or discontinuity in position.

Figure 1:
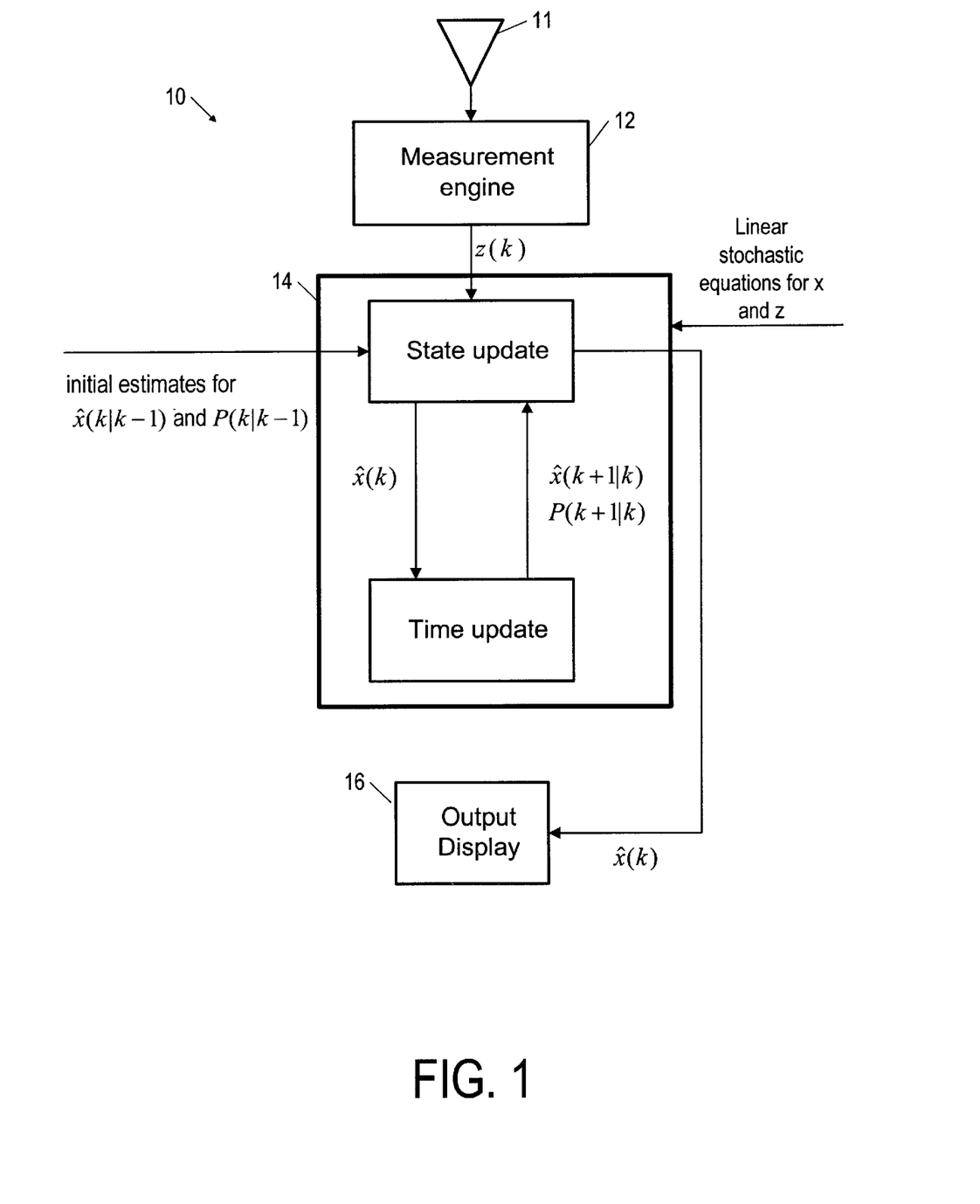
FIG. 1 is a flow diagram/block diagram of a positioning system based on a Kalman filter.

It is known in the art to use a Kalman filter to account for the uncertainties in measurement data provided to a positioning system receiver. FIG. 1 is a simplified flow diagram of a conventional GPS-type positioning system 10 including an RF antenna 11, a measurement engine 12 and a Kalman filter 14, providing a position estimate $\hat{x}(k)$ for position at time instant k. The measurement engine 12 receives RF signals from a plurality of orbiting satellites via the antenna 11 and provides the Kalman filter 14 with measured position and velocity, i.e. measured state information as opposed to the predicted state information provided by the Kalman filter based on the measured values.

The construction of the measurement engine 12 varies from application to application. Generally, the measurement engine 12 contains the analog electronics (e.g. preamplifiers, amplifiers, frequency converters, etc.) needed to pull in the RF signal, and further includes a code correlator for detecting a particular GPS code corresponding to a particular satellite. The measurement engine 12 estimates the line of sight (LOS) range to a detected satellite using a local, onboard GPS clock and data from the satellite indicating when the satellite code was transmitted. The LOS ranges determined this way are called pseudo-ranges because they are only estimates of the actual ranges, based on the local detection time. In the positioning system 10 of FIG. 1, the measurement engine 12 converts the pseudo-ranges it acquires over time to measurements z(k) of the state of the process, i.e. to a position and velocity of the moving object whose position is being determined.

In estimating the state x(k) of a process (such as the motion of a vehicle), a (standard) Kalman filter relies on the assumption that the process evolves over time according to a linear stochastic difference equation, such as:

$$x(k+1)=A(k)\times(k)+Bu(k)+w(k) \tag{1}$$

where w(k) is the process noise, A(k) is an n×n matrix relating the state at time step k to the state at time step k+1 in the absence of a driving function, u(k) is a control input to the state x, and B is an n×l matrix that relates the control input to the state x. A standard Kalman filter further relies on the assumption that the measurements used by the Kalman filter in estimating the state of the process are linearly related to the state of the process, i.e. that a measurement z(k) (i.e. the measured position at time instant k) is corresponds to the state x(k) (i.e. the actual position at time instant k) according to an equation of the form:

$$z(k)=H(k)\times x(k)+s(k) \quad (2)$$

where s(k) is the measurement noise, and the m×n matrix H relates the state x(k) to the measurement z(k). If either of these assumptions do not apply, a standard Kalman filter cannot be used, or at least not used without first deriving from information provided (by e.g. satellites) about the process measurement data that is, at least approximately, linearly related to the state of the process, and at least not without taking measurements at close enough intervals that the effects of any non-linearity in the evolution of the process does not become important from one measurement to the next.

In the case of a positioning system in a vehicle where the positioning system uses information from satellites as the basis for position measurements, the dependence between the state (position, but in general also velocity) of the process (motion of the vehicle hosting the positioning system), and the position measurements is non-linear, i.e. instead of equation (2), the satellite provides a pseudo-range:

$$\rho(k)=\sqrt{\sum_{i=1}^{3}[x_i(k)-x_i^s(k)]^2} + ct_o$$

in which $x_i(k)$ is, e.g. the $i^{th}$ component of the three-dimensional position of the vehicle, $x_i^s$ is the same for the satellite, $t_o$ is a clock offset between the positioning system clock in the vehicle and the satellite clock, and c is used to designate the speed of light.

It is known in the art, generally, that in case either of the assumptions on which a standard Kalman filter relies is violated, a so-called extended Kalman filter can be used. (Sometimes what is called a converted-measurement Kalman filter (CMKF) is used, instead of an extended Kalman filter, in case of non-linear measurements.) In such a filter, there is a linearizing about the current mean and covariance of the estimated state of a process and for the measurements used in estimating the state of the process. This linearizing makes possible the use of a Kalman-type filter in estimating the state of a process, an approach that is recursive (the solution at a preceding instant, along with a current measurement, leading to the solution at the next instant), as compared with other approaches, such as iterative or direct solution, that rely on the current measurement (alone) for solution.

Although extended Kalman filters are known in the art, the prior art does not teach using such a filter, or using other types of filters, in a positioning system based on information provided by cellular base stations, or, ideally by both cellular base stations and satellites, so that at any one instant of time, information either from only cellular base stations, or from both cellular base stations and satellites, are used as one measurement of the state of the system.

What is further needed is a way for a positioning system to combine multiple such measurements, at any instant of time, so as to further increase the reliability of the positioning system. Since cellular base station data does not suffer from the same errors as affect satellite data, a positioning system can be made more reliable if it uses both kinds of data separately and simultaneously, providing therefore at least two measurements at the same instant of time, one purely based on satellite data and one purely based on cellular data. (The main sources of noise and inaccuracy in cellular data are not the same as for satellites; instead of atmosphere, multi-path, and selective availability, error in a cellular system is caused by obstacles in the signal path, range measurement quantization, and interfering frequencies.)

Even though the use of two different types of sources of positioning measurements can provide an inherently more reliable positioning system, it is still true that at any instant of time a particular measurement or a particular as piece of information on which a measurement is based can be greatly impaired by one or another source of error (not usually the selective diversity, which is intended only to "dither" the correct measurement). Thus, it remains advantageous, even in case of a hybrid positioning system (hybrid in the sense of different kinds of sources of measurement), to systematically eliminate some measurements or some pieces of information (e.g. a pseudo-range value) from which a measurement is determined (by triangulation of several pseudo-range values), the eliminating based on statistical measures of the error of the measurements or pieces of information.

SUMMARY OF THE INVENTION

Accordingly, the present invention provides a filter for a generalized positioning system, and also a corresponding generalized positioning system and method. All of these are based on using information from cellular base stations, at least part of the time, in providing a succession of estimates of one or another aspect of the state of motion of an object, such as estimates of position or velocity or both. The generalized positioning system includes: a filter, responsive to an initial estimate of a state of motion of the object, and an initial value of state covariance, and further responsive to a succession of measurements of the state, each corresponding to a different instant of time, for statistically determining the succession of state estimates; and a measurement engine, responsive to information provided by cellular base stations, from which a measurement of the state can be determined, for providing the succession of measurements of the state. In some aspects of the invention, the filter is a non-linear filter, such as an extended Kalman filter, and in other aspects of the invention the filter is a linear filter.

In a further aspect of the invention, the generalized positioning system also includes: means for determining association probabilities for a plurality of state measurements all at a same instant of time, each association probability corresponding to a particular state measurement at the instant of time, and also means for determining an association probability providing a value for the probability that none of the plurality of measurements is correct; means for combining into a single measurement innovation each individual innovation using the association probabilities as weightings; and means for determining the covariance of the updated state based on the individual association probabilities, the association probability for providing a value for the probability that none of the measurements is correct, and the combined measurement innovation.

In another aspect of the invention, the filter of the generalized positioning system is responsive to measurements provided by a measurement engine receiving information from both satellites and cellular base stations.

In yet another aspect of the invention, the generalized positioning system also includes an output display, wherein both the measurement engine and the output display are co-located with the object for which the state information is to be measured, and further wherein the filter, the means for determining association probabilities, the means for combining into a single measurement innovation each individual innovation, and the means for determining the covariance of the updated state are all hosted by a non-local facility, one that is separate and remote from the object for which the state information is to be measured, and wherein the non-local facility and the measurement engine and the output display are in radio communication.

In yet still another aspect of the invention, the generalized positioning system filter is responsive to a finite gate width $\gamma$ of a validation region, and rejects a measurement if it falls outside the validation region.

In yet even a further aspect of the invention, the generalized positioning system also includes: an output display, wherein both the measurement engine and the output display are co-located with the object for which the state information is to be measured, and further wherein the filter is hosted by a non-local facility, one that is separate and remote from the object for which the state information is to be measured, and wherein the non-local facility and the measurement engine and the output display are in radio communication.

In one particular application, the generalized positioning system filter is an extended Kalman filter (EKF).

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

In the preferred embodiment, as is described below, the present invention involves the use of an extended Kalman filter (EKF) as part of a positioning (navigation) system. It is to be understood, however, that the present invention is not restricted to using only an EKF or any other non-linear filter in such a system, but instead can use any kind of filter in a position-measuring system, or in a system that measures another aspect of the motion of an object, such as velocity, and so is here called a generalized positioning system (because it does not necessarily measure position).

Background on Standard Kalman Filter and Notation Used

Referring again to FIG. 1, in a positioning system 10 according to the prior art, a Kalman filter 14 is sometimes used to estimate the state x(k) of a process, such as the position and velocity of a vehicle in motion, based on measurements related to the process. The (unknown and never perfectly knowable) state x(k) of a discrete-time controlled process is assumed governed by equation (1), and measurement z(k) is assumed to correspond to the state x(k) according to equation (2). The measurement z(k) is provided by a measurement engine 12 based on information received by an antenna 11.

The Kalman filter uses the measurements z(k), along with knowledge of the dynamical equation (eq. 1), to determine an a posteriori estimate $\hat{x}(k|k-1)$ that takes into account the measurements z(k) more or less, depending on a Kalman gain, K(k), calculated as described below. The estimate $\hat{x}(k|k-1)$ is said to be a posteriori in that it is made after the measurements z(k), taking those measurements into account.

A central assumption in using a Kalman filter is that the process noise and the measurement noise are both white, and with normal probability distributions:

$$p(w(k)) \sim N(0, Q(k)) \qquad (3)$$

$$p(s(k)) \sim N(0, R(k)) \qquad (4)$$

where Q(k) is the process noise covariance (matrix), and R(k) is the measurement error covariance (matrix). (Here, N(a,b) is the normal distribution with mean a and covariance b.) In the implementation of a Kalman filter, the R(k) and Q(k) for the filter are sometimes measured, or values are assumed, once and for all before using the filter. The selection of values to be used for R(k) and Q(k) is said to constitute "tuning" the filter, and is sometimes performed off-line, using another Kalman filter. In some applications, R(k) and Q(k) are taken to be constant.

Referring again to FIG. 1, the operation of a Kalman filter, in general, is in two parts: a time update part and a measurement update part. In the time update part, the output of the Kalman filter (i.e. the a posteriori estimated state $\hat{x}(k)$) is used in the assumed dynamical equation (1) to determine an a priori estimate $\hat{x}(k+1|k)$ of the next state of the process:

$$\hat{x}(k+1|k) = A(k)\hat{x}(k) + Bu(k). \qquad (5)$$

Here, the notation $\hat{x}(k+1|k)$ is used to show expressly that the value obtained is based on assuming the a posteriori estimate $\hat{x}(k)$.

The time update part also determines the so-called a priori estimate error covariance using the equation:

$$P(k|k-1) = A(k)P(k)A^T(k) + Q(k). \qquad (6)$$

where the a priori estimate error covariance $P(k|k-1)$ is based on the a priori estimate error $x(k) - \hat{x}(k|k-1)$, and is defined as:

$$P(k|k-1) = E[(x(k) - x(k|k-1))(x(k) - x(k|k-1))^T] \qquad (7)$$

in which E(a) is the expectation of the random variable a, and where P(k) is the corresponding a posteriori estimate error covariance, based on the a posteriori estimate error $x(k) - \hat{x}(k)$.

In the second, measurement update part of the operation of a Kalman filter, the Kalman gain K(k+1) is calculated, using:

$$K(k+1) = P(k+1|k)H^T(k+1)[H(k+1)P(k+1|k)H^T(k+1) + R(k+1)]^{-1} \qquad (8)$$

and is then used to determine the a posteriori state estimate $\hat{x}(k+1)$, according to:

$$\hat{x}(k+1)=\hat{x}(k+1|k)+K(k+1)\upsilon(k+1), \tag{9}$$

where $\upsilon(k+1)$ is the so-called measurement innovation (or measurement residual), defined as:

$$\upsilon(k+1)=z(k+1)-H(k+1)x(k+1|k). \tag{10}$$

The estimate $\hat{x}(k+1)$ is then output to an output display 16 as the Kalman filter's estimate of the state of the process as the time corresponding to k+1, and is also used in the next first, time update part of the operation of the Kalman filter. Finally, the first, update part of the operation also requires a new a posteriori estimate error covariance, $P(k+1)$, which is calculated using:

$$P(k+1)=[I-K(k+1)H(k+1)]P(k+1|k). \tag{11}$$

The operation of the Kalman filter must of course be started with initial estimates for $\hat{x}(k+1|k)$ and for $P(k+1|k)$, and the prior art includes suggestions for how to select initial values.

Extended Kalman Filter with Cellular Measurement Information

Figure 2:
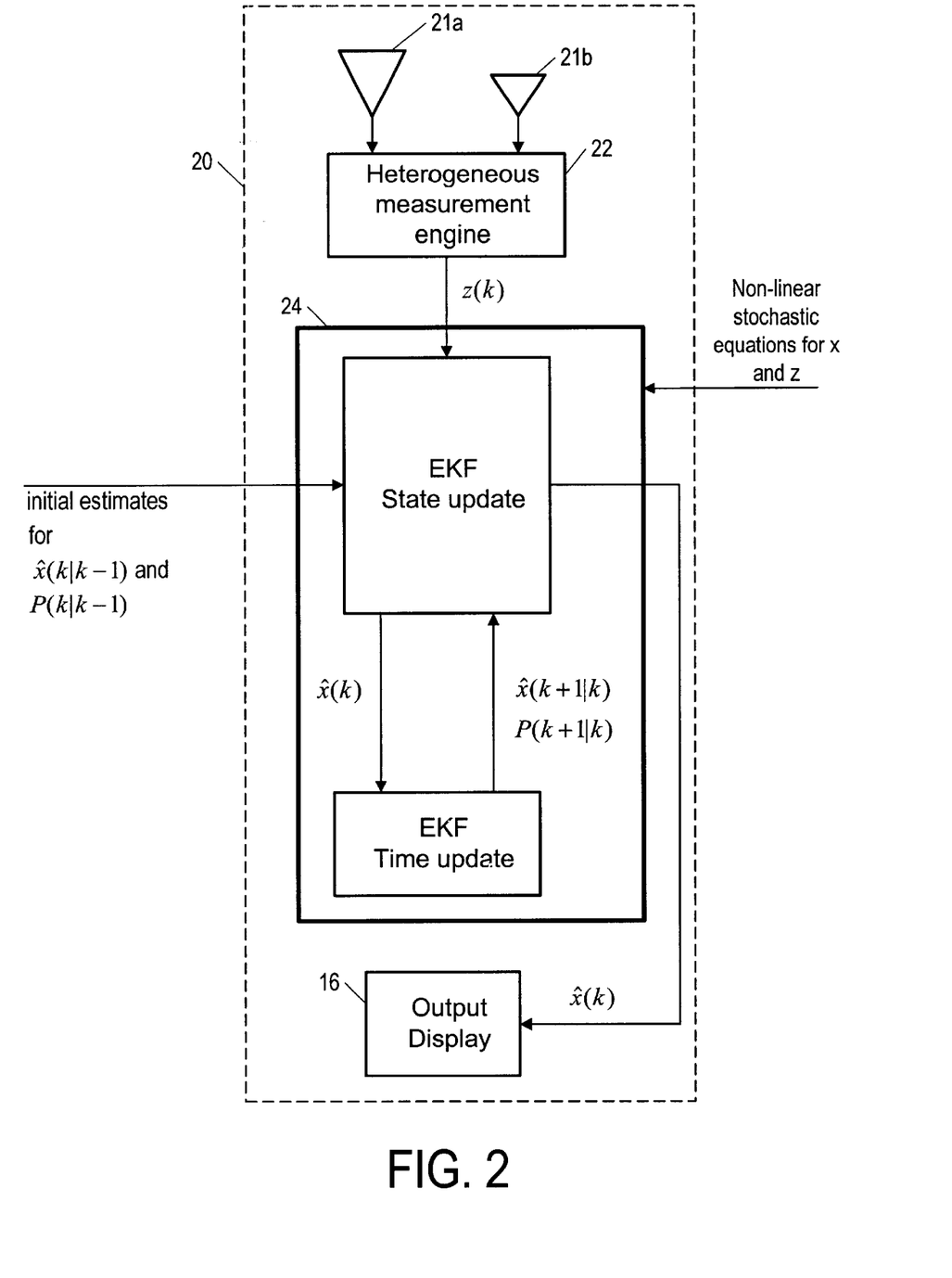
FIG. 2 is a flow diagram/block diagram of a positioning system based on an extended Kalman filter, according to the present invention, with information acquired from both satellites and cellular base stations.

Referring now to FIG. 2, in the present invention, a positioning system 20 is based on an extended Kalman filter 24 (EKF), so as to enable using as a (single) measurement at an instant of time, information acquired from cellular base stations, and preferably, also from satellites. From such information, as in a standard Kalman filter, a time update of the state of the system (i.e. the position and, optionally, velocity of the object hosting the positioning system) and then a measurement update is performed. Measurement $z(k)$ is provided by a heterogeneous measurement engine 22 at an instant k of time, based on information received by different antennae 21a and 21b, which are different in kind in that one is intended to receive information from one kind of source of information, such as satellites, and the other is intended to receive information from another kind of source of information, such as cellular base stations.

At some times in the operation of a positioning system using the present invention, information from cellular bases stations may be so less reliable than information from satellites that it is advantageous to use only satellite data. In the best mode, a positioning system according to the present invention, besides having the ability to automatically choose to disregard the cellular data (or the satellite data), would allow a user to command that the cellular data (or the satellite data) not be used.

In performing the state and time updates, and thus ultimately providing an estimate $\hat{x}(k)$ of the state of the system based on measurements $z(k)$ and previous estimate $\hat{x}(k-1)$, the EKF does not assume the linear stochastic difference equations (1) and (2), but instead assumes that the process is governed by a non-linear stochastic difference equation, indicated as:

$$x(k+1)=f[x(k),u(k),w(k)] \tag{12}$$

(where again $u(k)$ is a driving function, and $w(k)$ is a zero mean process noise) and, correspondingly, that the measurement $z(k)$ and state $x(k)$ have a non-linear relationship, indicated as:

$$z(k)=h[x(k),s(k)] \tag{13}$$

(where $s(k)$ is again the zero-mean measurement noise).

With these assumptions and knowledge of the functions f and h, operation of the EKF is based on approximating the state and measurement vectors (the approximation of the measurement vector for use in determining the measurement innovation) using equations (12) and (13) but using a value of zero for both the process and measurement noise, w and s, i.e.

$$\tilde{x}(k+1)=f[\hat{x}(k),u(k),0], \text{ and} \tag{14}$$

$$\tilde{z}(k)=h[\tilde{x}(k),0] \tag{15}$$

and asserting that the approximated state vector is the a priori (predicted) state vector, i.e.

$$\hat{x}(k+1|k)=\tilde{x}(k+1). \tag{16}$$

The non-linear equations (12) and (13) are then linearized by performing essentially a Taylor series expansion about $\tilde{x}$ and $\tilde{z}$, as given by equations (14) and (15). This linearizing process produces the equations of the EKF (see below) in terms of four Jacobians, which are each matrices, having components:

$$A_{i,j} = \frac{\partial f_{[i]}}{\partial x_{[j]}}[\hat{x}(k), u(k), 0], \tag{17}$$

$$W_{i,j} = \frac{\partial f_{[i]}}{\partial w_{[j]}}[\hat{x}(k), u(k), 0], \tag{18}$$

$$H_{i,j} = \frac{\partial h_{[i]}}{\partial x_{[j]}}[f(\hat{x}(k), u(k), 0), 0], \text{ and} \tag{19}$$

$$V_{i,j} = \frac{\partial h_{[i]}}{\partial s_{[j]}}[f(\hat{x}(k), u(k), 0), 0] \tag{20}$$

where x and z are actual state and measurement vectors respectively, $\hat{x}(k|k-1)$ is an a priori state estimate, $\hat{x}(k)$ is an a posteriori state estimate, and w and s again represent the process and measurement noise. Thus, e.g. the i-j$^{th}$ element of the Jacobian matrix A is the partial derivative of the i$^{th}$ component of the vector function f with respect to the j$^{th}$ component of the state vector $x(k)$, evaluated at $w(k)=0$ and at $x(k)=\hat{x}(k)$. (The state x can have more than three, spatial coordinates; it can e.g. have six components, three for spatial position and three for velocity.)

Based on linearizing the governing equations (12) and (13), and using the Jacobians defined by equations (17)–(20), an EKF operates as follows. Referring again to FIG. 2, first an initial estimate is provided for $\hat{x}(k|k-1)$ (i.e. a value: for each component of the state vector is provided for the predicted state at the first instant of time), and also for the covariance $P(k|k-1)$ (i.e. a value is provided for the covariance of each component of the state vector at the first instant of time). The prior art includes suggestions for how to select initial values.

Next, a measurement update is performed in which the estimate of the state vector output by the positioning system is made. This is accomplished first by computing the so-called Kalman gain, $K(k)$, according to:

$$K(k)=P(k|k-1)H^T(k)[H(k)P(k|k-1)H^T(k)+V(K)R(k)V^T(k)]^{-1} \tag{21}$$

and is then used to determine the a posteriori state estimate $\hat{x}(k+1)$, according to:

$$\hat{x}(k)=\hat{x}(k|k-1)+K(k)\upsilon(k), \tag{22}$$

where υ(k) is the measurement innovation (or measurement residual), which for the EKF is calculated using:

$$\upsilon(k)=z(k)-h[\hat{x}(k|k-1),0] \quad (23)$$

based on defining the measurement innovation as z(k)−z̃(k), using equation (15) for z̃(k) and asserting equation (16). The estimate x̂(k) is then output to an output display 16 as the Kalman filter's estimate of the state of the process as the time corresponding to k+1, and is also used in the next first, time update part of the operation of the Kalman filter. (The matrix V is the identity matrix in the case that the noise is assumed to be white.) Finally, as in operation of the standard Kalman filter, the first, measurement update part of the operation also requires a new a posteriori estimate error covariance, P(k), which is again (as in the standard Kalman filter) calculated using:

$$P(k)=[I-K(k)H(k)]P(k|k-1). \quad (24)$$

In the next, time update part, the output of the Kalman filter (i.e. the a posteriori estimated state x̂(k)) is used in equation (14) and using the asserted equation (16), to determine an a priori estimate x̂(k+1|k) of the next state of the process:

$$x(k+1|k)=f[\hat{x}(k),u(k),0]. \quad (25)$$

The time update part also again (as in the standard Kalman filter) determines the so-called a priori estimate error covariance, here using the equation:

$$P(k|k-1)=A(k)P(k)A^T(k)+W(k)Q(k)W^T(k) \quad (26)$$

where the a priori estimate error covariance P(k|k−1) is based on the a priori estimate error x(k)−x̂(k|k−1), and is defined as:

$$P(k|k-1)=E[(x(k)-\hat{x}(k|k-1))(x(k)-\hat{x}(k|k-1))^T] \quad (27)$$

in which E(a) is the expectation of the random variable a, and where P(k) is the corresponding a posteriori estimate error covariance, based on the a posteriori estimate error x(k)−x̂(k). (The matrix W is the identity matrix in the case that the noise is assumed to be white.)

Extended Kalman Filter with Probabilistic Data Association

The positioning system based on an EKF, as described above, with inputs from cellular base stations, or with inputs from cellular base stations and also satellites, proceeds on the basis of a single measurement z(k) at each instant of time. (The single measurement z(k) uses information from several sources, at least some of them cellular base stations.) The positioning system can be made more reliable by combining several measurements $z_i(k)$ at each instant of time, at least some of which are based on information provided by cellular base stations. Such a positioning system is here called a multi-source positioning system.

Figure 3:
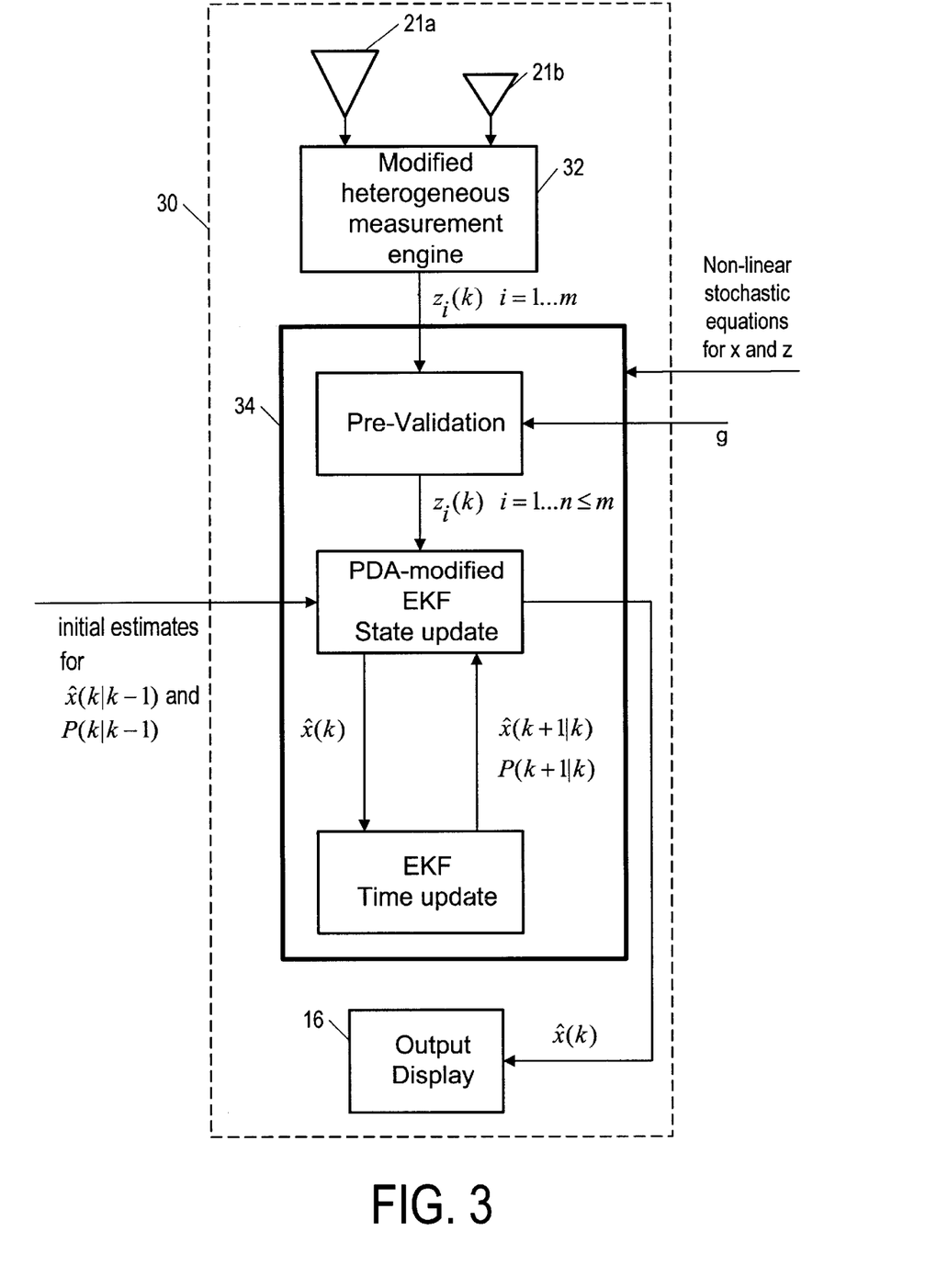
FIG. 3 is a flow diagram/block diagram of a positioning system based on an extended Kalman filter, according to the present invention, modified to incorporate probability data association (PDA), with statistical pre-processing of inputs, and with information acquired from both satellites and cellular base stations.

Referring now to FIG. 3, in another aspect of the present invention, a positioning system 30 uses an EKF 34 modified to use probabilistic data association (PDA), so as to enable using a combination of measurements at each instant of time, at least one measurement being based at least partially on information received from a cellular base station. In the preferred embodiment of this aspect of the present invention, up to m different measurements $z_1(k), z_2(k), \ldots, z_m(k)$ are provided by a modified heterogeneous measurement engine 32 at each instant k of time, based on, information received by different antennae 21a and 21b, which are different in kind in that one is intended to receive information from one kind of source of information, such as satellites, and the other is intended to receive information from another kind of source of information, such as cellular base stations. The modified heterogeneous measurement engine 32 here, in this multi-source positioning system that is based on what is here called a multi-source EKF, is fundamentally the same as the heterogeneous measurement engine 22 of the single-measurement-at-a-time EKF 24, except that it provides the m measurements at each instant k of time.

According to the present invention, it is assumed that the probability density function of the object's state estimate x̂(k) (i.e. the object's position and velocity), as provided by the EKF of the present invention, is normally distributed when conditioned on the set Z(k−1) of all previous measurements up to the (k−1)th instant of time, i.e. that $$p[\hat{x}(k)|Z(k-1)]=N[\hat{x}(k);\hat{x}(k|k-1),P(k|k-1)], \quad (28a)$$

which corresponds to the assumptions indicated as equations (3) and (4). It is further assumed that all measurement innovations (residuals) $\upsilon_j(k)$ are also normally distributed when conditioned on all previous measurements Z(k−1), i.e. that $$p[\upsilon_j(k)|Z(k-1)]=N[\upsilon_j(k);0,P(k|k-1)], \quad (28b)$$

the mean taken to be zero since the measurement noise is assumed to be white. Under these assumptions, association probabilities (i.e. associated with measurements) are determined according to:

$$\beta_j(k) = e_j(k)\left[b(k) + \sum_{j=1}^{m(k)} e_j(k)\right]^{-1} \quad (29)$$

for j=1 ... m(k), where m(k) is the number of measurements; where $$e_j(k)=P_G^{-1}N[\upsilon_j(k);0,S(k)], \quad (30)$$

in which $\upsilon_j(k)$ is the measurement innovation for the $j^{th}$ measurement and S(k) is the innovation covariance at instant k, i.e. $S(k)=H(k)P(k|k-1)H^T(k)+R(k)$; where $$b(k)=m(k)(1-P_D P_G)[P_D P_G V(k)]^{-1} \quad (31)$$

in which V(k) is the volume of a validation region, described below (equation 40); and where a special association probability is defined corresponding to the probability that none of the measurements is correct (or, equivalently, the probability that at least one measurement is correct, subtracted from one), given by $$\beta_0(k) = b(k)\left[b(k) + \sum_{j=1}^{m(k)} e_j(k)\right]^{-1}. \quad (32)$$

Note that the Kalman gain K(k), given by equation 8, can also be expressed in terms of the innovation covariance $S(k)=H(k)P(k|k-1)H^T(k)+R(k)$, as $K(k)=P(k|k-1)H^T(k)S^{-1}(k)$.

In equation (31) the quantity $P_D$ is the so-called probability of detection, and is pre-determined; it is the probability that the correct measurement is obtained. It is specified a priori by a user of the positioning system. There are many ways to evaluate $P_D$; it can be evaluated statistically, analytically, or heuristically (trial and error). Since a measurement will always have some error associated with a condition impeding the measurement, such as an inability to see all of the satellites or base stations all of the time because of blockage or equipment failures: including receiver malfunctions, in practice $P_D$ will never be equal to unity.

The quantity PG in equations (30) and (31) is a so-called gate probability. It is a factor used to restrict the normal distribution of the measurement innovation based on the width of a validation gate. If there is no pre-validation of measurements, so that any measurement is provided to the EKF, then $P_G$ has a value of one, corresponding to a gate of infinite width. $P_G$ has a value of less than one when measurements too far from a predicted measurement are ejected. Using such a value for $P_G$ amounts to eliminating the edges of the normal distribution of the measurements. Values of $P_G$ of less than one are found from a chi-square tail probability tables as a function of the measurement dimension $n_z$ (i.e. the number of degrees of freedom of the measurement, which for only a range measurement is one, and for a combined range and Doppler measurement is two) and the width $\gamma$ of the validation gate (taking $\gamma$ as the value of the tail probability). Using g to denote $\sqrt{\gamma}$, (g therefore equal to a number of standard deviations, g can be pre-determined to have a value limiting the accepted measurement to only ⅔ of any set of measurements, on average. In the present invention, as indicated in FIG. 2, it is the value of g that is pre-determined, and from which the value of $P_G$ is inferred.

The volume V(k) of the validation region is defined as:

$$V(k) = c_{n_z} g^{n_z} |S(k)|^{1/2} \tag{33}$$

(using $g = \sqrt{\gamma}$) in which $$c_{n_z} = \frac{\pi^{n_z/2}}{\Gamma(n_z/2 + 1)}, \tag{34}$$

where $\Gamma(a)$ is the gamma function (so that, e.g. $\Gamma(n+1) = n!$ where n is an integer). $c_{n_z}$ can also be interpreted to as the volume of the $n_z$-dimensional unit hypersphere. Thus, e.g. $c_1 = 2$; $c_2 = \pi$; $c_3 = \pi/3$, etc. Equation (34) is the general expression for $c_{n_z}$.

With the association probabilities $\beta_i(k)$ determined according to equations (29) and (32), a combined innovation $\upsilon(k)$ is determined, according to:

$$\upsilon(k) = \sum_{i=1}^{m(k)} \beta_i(k) \upsilon_i(k) \tag{35}$$

and used to update the state of the process, according to equation (9), i.e. as in a standard Kalman filter.

Although the update to the state of the process is calculated as usual, the covariance associated with the updated state, i.e. the a posteriori estimate error covariance, P(k+1), is calculated differently than in a standard Kalman filter, i.e. not according to equation (11). Instead, it is obtained using:

$$P(k) = \beta_0(k) P(k|k-1) + [1 - \beta_0(k)] P^c(k) + \tilde{P}(k) \tag{36}$$

where $P^c(k)$ is the covariance of the state updated with the assumed to be correct measurement (i.e. it is the covariance of the state evaluated with $\beta_0(k)$ is set to zero), and is given by $$P^c(k) = P(k|k-1) + K(k) S(k) K^T(k), \tag{37}$$

and where $\tilde{P}(k)$ is the spread of innovations, given by $$\tilde{P}(k) = K(k) \left[ \sum_{i=1}^{m(k)} \beta_i(k) \upsilon_i(k) \upsilon_i^T(k) - \upsilon(k) \upsilon^T(k) \right] K^T(k). \tag{38}$$

Thus, the weighting of measurements in a Kalman filter, given by equation (36) and intended to correspond to the reliability of the measurements, is different in the PDA-modified EKF of the present invention, given by equation (11). In fact, the weighting differs from the standard Kalman filter weighting in that it is more responsive to changes in the reliability of the measurements. This greater responsiveness by a PDA-modified EKF is prudent because the PDA-modified EKF will reject measurements that are too far from what is expected, so that giving greater credence to the remaining measurements is sensible. The modified weighting is thus more appropriate for measurements provided by different measurement sources, such as both satellites and cellular base stations. To significantly alter the weighting in a standard Kalman filter, it is usually necessary to use some means external to the EKF, or else to reinitialize the EKF. In the preferred embodiment in which the PDA-modified EKF is implemented as software, the cost of the greater responsiveness is a slightly greater computational load, compared to a standard EKF.

Extended Kalman Filter-Based Positioning System with Pre-Validation

Still referring to FIG. 3, in another aspect of a positioning system according to the present invention, a pre-validation of measurements is performed by a pre-validation module using a pre-determined (finite) value of g corresponding to a finite gate width $\gamma$, using the same notation as above. In performing the pre-validation, the measurements are assumed to be normally distributed, having a probability density function, $$p(z(k+1)|Z(k)) = N[z(k+1); \hat{z}(k+1|k), S(k+1)], \tag{39}$$

where again Z(k) is the set of all previous measurements, of any dimension, up to the $k^{th}$ instant, and where $\hat{z}(k+1|k)$, called the measurement prediction, is merely shorthand for the term $H(k+1)\hat{x}(k+1|k)$, as in, e.g. equation (10). Next, a validation region is defined, based on the above-described gate parameter gamma, that changes with each instant k of time; it is given by, $$V(k+1, \gamma) = \{z(k+1) : [z(k+1) - \hat{z}(k+1|k)]^T S^{-1}(k+1)[z(k+1) - \hat{z}(k+1|k)] \leq \gamma\} \tag{40}$$

where $S^{-1}(k+1)$ is the inverse of the innovation covariance, and where $\gamma$ is again, as above, a pre-defined threshold obtained from the one-sided chi square distribution. Again denoting $\sqrt{\gamma}$ by g, equation (40) is also sometimes written as, $$\upsilon^T(k+1) S^{-1} \upsilon(k+1) \leq g^2 \tag{41}$$

where, as above, $\upsilon(k+1)$ is the measurement innovation, i.e. $z(k+1) - \hat{z}(k+1|k)$ There is a certain probability that a measurement will fall in the validation region. The value of g is pre-determined to affect such a probability: the greater the value of g, the greater the probability that a measurement will fall in the validation region. If, for a particular measurement, the left-hand side of equation (41) evaluates to an amount greater than $g^2$, the measurement is declared an outlier, and is not used by the EKF in making its next estimate of position (state of the process).

Thus, in the present invention, one assumes a Gaussian probability density function for measurements, with a width determined by the value of g, a value that can be set based on one or more of various considerations, as discussed above.

It is important to note that some of the terms in the above PDA and g-sigma gate equations are directly obtained from the extended EKF used in estimating position. It is also important to note that the use of PDA weighting does not exclude using signal to nose ratios (SNRs), bit error rates (BERs), or other inputs for outlier rejection or measurement weighting.

Distributed Filtering

Although in the preferred embodiment the filtering is performed in the positioning system itself, it is also important and in fact in some implementations desirable to have one or more components of the filter implemented in a computing facility that is separate and apart from the positioning system components moving with the object being tracked, and may be in only radio communication with those positioning system components.

Figure 4:
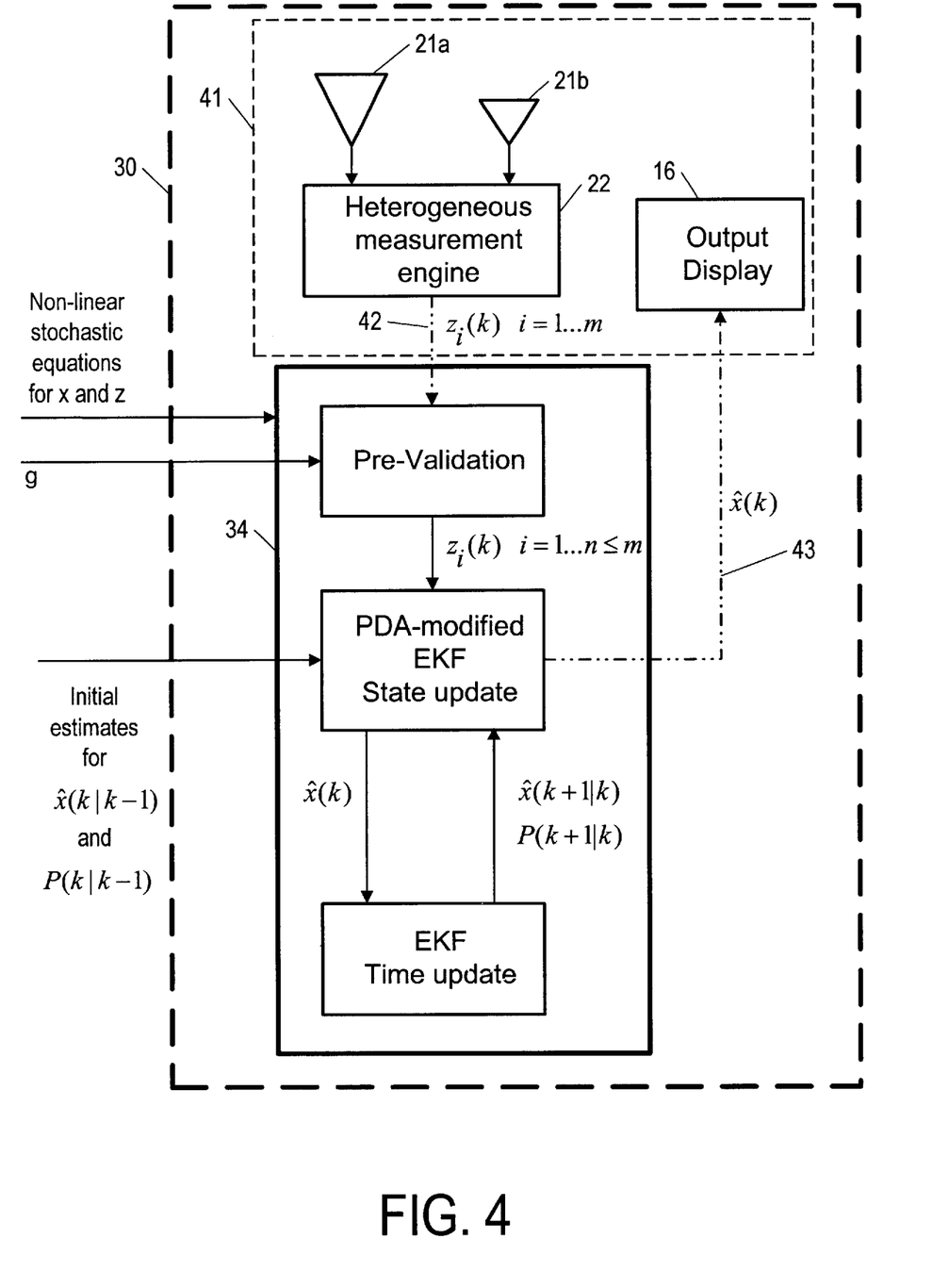
FIG. 4 is a flow diagram/block diagram of a distributed positioning system similar to the system of FIG. 3 but with some components remote from the object making use of the positioning system.

Thus, referring now to FIG. 4, a distributed positioning system according to the present invention is shown as including local components 41 moving with the object being tracked and also including non-local components 34, the filtering hardware modules, hosted by a remote facility. The non-local components 34 perform the filtering computations of the present invention, and are in only radio communication with the local modules 41 of the positioning system, the heterogeneous measurement engine 22 and the output display 16. The radio communication is indicated by the dashed lines 42 representing radio communication signals by which the, outputs of the heterogeneous measurement system are provided to the filter modules 34 (i.e. the non-local components), and by the dashed lines 43 representing radio communication signals by which the outputs of the filter modules 34 are provided to the output display 16. (The antennae and associated receiver and transmitter hardware needed to accomplish the indicated radio communications are implied.)

In such an embodiment, the non-local components 34 perform the filtering computations for not only a particular positioning system with local components 41, but also for other positioning systems, not shown, also having only some components on-board the object making use of the positioning system. In some applications, the non-local components 34 would be part of a telecommunications network that would communicate with each different positioning system using a protocol similar to what is used in cellular telephone communications.

Figure 5:
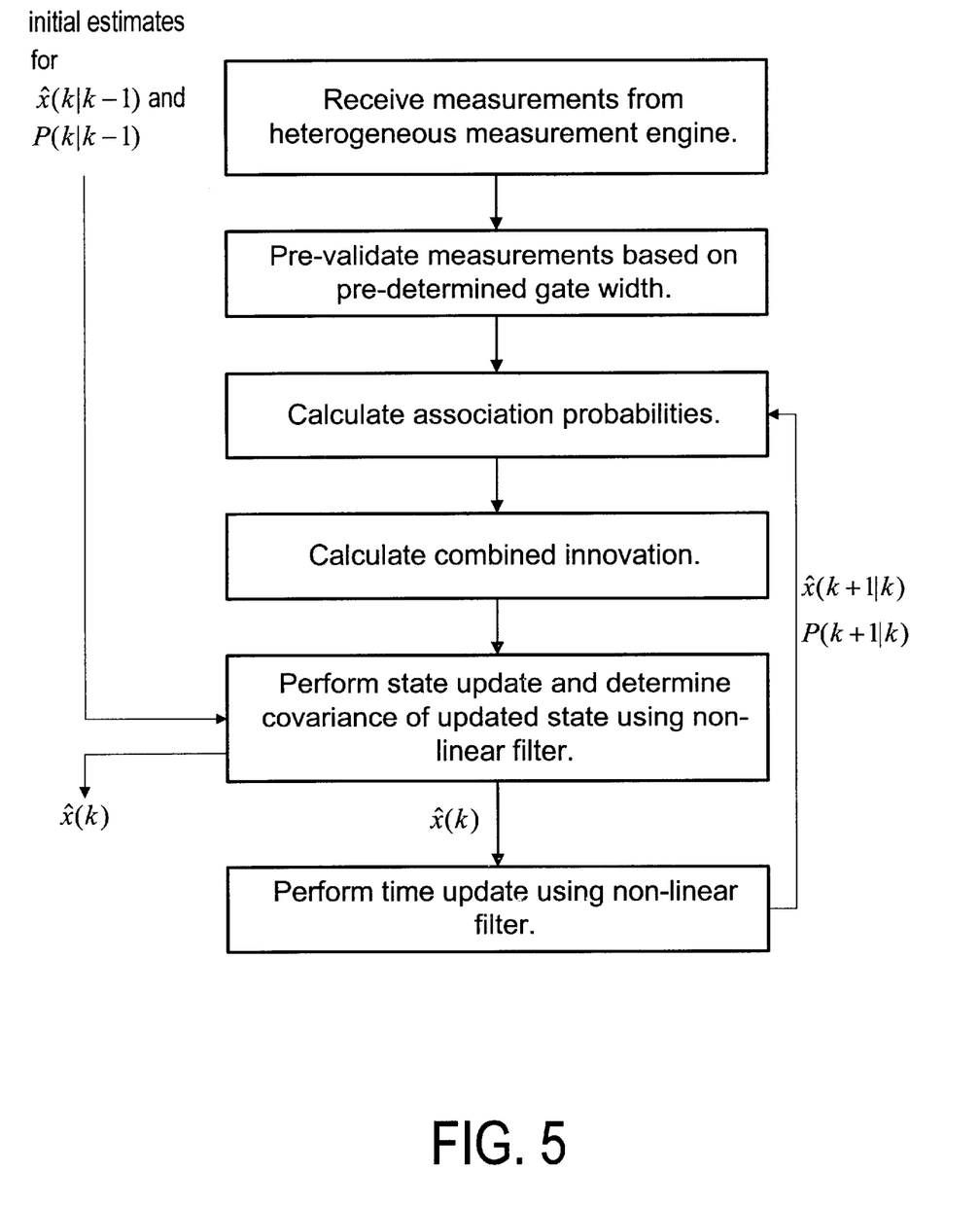
FIG. 5 is a flowchart of a method of filtering measurements of state information, according to the present invention.

Referring now to FIG. 5, a flowchart of a method, according to the present invention, of filtering measurements in a generalized positioning system is shown.

It is to be understood that the above-described arrangements are only illustrative of the application of the principles of the present invention. In particular, as indicated above, the present invention comprehends not only filters that might be referred to as extended Kalman filters, but any kind of filter in a position-measuring system, e.g. any kind of filter that accepts measurements of state information for a process that is governed by a non-linear stochastic difference equation (equation 12). Further, a positioning system according to the present invention will not, of course, always yield an estimate of position, since in some situations there will not be adequate measurement data due, for example, to environmental affects that temporarily prevent receiving data from the number of sources needed to estimate position. In such a case, the positioning system might temporarily estimate only a heading and a clock bias.

Thus, it should also be understood that the present invention applies equally well to systems that are not, strictly, positioning systems, but instead are systems that in general estimate one or another aspect of the motion of an object, position being only one aspect. In case of estimating position, the system may aptly be called a "positioning system," even though it may estimate values for other aspects of the motion. But in other cases the aspect of the motion that is most important may be other than position; it may, for example, be angular velocity, or linear or angular acceleration, or simply linear velocity. In general, therefore, the present invention is for use as part of a system that is most aptly described as a generalized positioning system, and is to be understood to encompass estimating, in some applications, position, but in other applications, other aspects of motion, not necessarily including position.

In addition, numerous modifications and alternative arrangements of the embodiments disclosed here may be devised by those skilled in the art without departing from the spirit and scope of the present invention, and the appended claims are intended to cover such modifications and arrangements.

What is claimed is:

1. A positioning system, comprising:
   a) a filter, responsive to an initial estimate of a state of motion of an object, and an initial value of state covariance, and further responsive to a succession of a plurality of measurements of the state, each plurality of measurements of the state corresponding to a different instant of time, for statistically determining a succession of state estimates; and
   b) a measurement engine, responsive to information provided at least in part by a cellular base station and from which a measurement of the state can be determined, for providing the succession of the pluralities of measurements of the state;
      wherein the filter comprises means for determining individual association probabilities, each corresponding to a respective state measurement from among the pluralities of state measurements at respective instants of time, for weighting innovations corresponding to each of the measurements in the pluralities of measurements of the state.

2. A positioning system as in claim 1, wherein the filter further comprises:
   a) means for determining an additional association probability providing a value for the probability that none of the plurality of measurements is correct;
   b) means for combining into a combined measurement innovation the individual innovations using the individual association probabilities as weightings; and
   c) means for providing an updated state and for determining a covariance of the updated state based on the individual association probabilities, and the association probability for providing a value for the probability that none of the measurements is correct, and also the combined measurement innovation.

3. A positioning system as in claim 1, wherein each measurement has a corresponding measurement innovation, wherein the means for determining the association probability at a $k^{th}$ instant of time for a $j^{th}$ measurement out of $m(k)$ state measurements is represented by $\beta_j(k)$ and is given by $$\beta_j(k) = e_j(k)\left[b(k) + \sum_{i=1}^{M(K)} e_i(k)\right]^{-1}$$

for j=1 . . . m(k), where $$e_j(k) = P_G^{-1} N[\upsilon_j(k); 0, S(k)],$$

in which $P_G$ is a gate probability, $N\{\ \}$ denotes the normal distribution, $\upsilon_j(k)$ is the measurement innovation for the $j^{th}$ measurement, and S(k) is an innovation covariance at instant k, given by $$S(k) = H(k)P(k|k-1)H^T(k) + R(k),$$

in which H(k) relates actual state information to measured state information, P(k|k−1) is an a priori estimate error covariance, and R(k) is a measurement error covariance, and where $$b(k) = m(k)(1 - P_D P_G)[P_D P_G V(k)]^{-1}$$

in which V(k) is the volume of a validation region, and $P_D$ is a probability of detection; and further wherein the means for determining an association probability providing a value for the probability that none of the plurality of measurements is correct is represented by $\beta_0(k)$ and is given by $$\beta_0(k) = b(k)\left[b(k) + \sum_{j=1}^{m(k)} e_j(k)\right]^{-1}.$$

4. A positioning system as in claim 3, wherein the filter is responsive to measurements provided by a measurement engine receiving information from both satellites and cellular base stations.

5. A positioning system as in claim 1, further comprising an output display, wherein both the measurement engine and the output display are co-located with the object for which the state information is to be measured, and further wherein the filter, the means for determining association probabilities, the means for combining into a combined measurement innovation each individual innovation, and the means for determining the covariance of the updated state are all hosted by a non-local facility, one that is separate and remote from the object for which the state information is to be measured, and wherein the non-local facility and the measurement engine and the output display are in radio communication.

6. A positioning system as in claim 1, wherein the filter is responsive to a finite gate width γ of a validation region, and wherein the filter rejects a measurement from among the plurality of measurements all at a same instant of time if the measurement falls outside the validation region.

7. A positioning system as in claim 6, wherein the validation region is defined by $$V(k+1,\gamma) = \{z(k+1):[\hat{z}(k+1|k)]^T S^{-1}(k+1)[z(k+1) - \hat{z}(k+1|k)] \leq \gamma\}$$

for some predetermined value of the gate width γ, in which $\hat{z}(k+1|k)$ is a prediction of a next measurement, and z(k+1) is the next measurement.

8. A positioning system as in claim 7, wherein the filter is responsive to measurements provided by a measurement engine receiving information from both satellites and cellular base stations.

9. A positioning system as in claim 1, wherein the filter is responsive to measurements provided by a measurement engine receiving information from both satellites and cellular base stations.

10. A positioning system as in claim 1, further comprising an output display, wherein both the measurement engine and the output display are co-located with the object for which the state information is to be measured, and further wherein the filter is hosted by a non-local facility, one that is separate and remote from the object for which the state information is to be measured, and wherein the non-local facility and the measurement engine and the output display are in radio communication.

11. A positioning system as in claim 1, wherein the filter is an extended Kalman filter (EKF).

12. A positioning system, comprising:
a) a filter, responsive to an initial estimate of a state of motion, and an initial value of state covariance, and further responsive to a succession of measurements of the state, each corresponding to a different instant of time, for statistically determining a succession of state estimates;
b) a measurement engine, responsive to information provided by positioning satellites, from which a measurement of the state can be determined, for providing the succession of measurements of the state;
c) means for determining association probabilities for a plurality of state measurements all at a same instant of time, each association probability corresponding to a particular state measurement at the instant of time, and also means for determining an association probability providing a value for the probability that none of the plurality of measurements is correct;
d) means for combining into a combined measurement innovation each individual innovation using the association probabilities as weightings; and
e) means for determining the covariance of the updated state based on the individual association probabilities, and the association probability for providing a value for the probability that none of the measurements is correct, and also the combined measurement innovation.

13. A positioning system as in claim 12, further comprising an output display, wherein both the measurement engine and the output display are co-located with the object for which the state information is to be measured, and further wherein the filter, the means for determining association probabilities, the means for combining into a combined measurement innovation each individual innovation, and the means for determining the covariance of the updated state are all hosted by a non-local facility, one that is separate and remote from the object for which the state information is to be measured, and wherein the non-local facility and the measurement engine and the output display are in radio communication.

14. A positioning system as in claim 12, wherein the filter is an extended Kalman filter (EKF).

15. A method, comprising the steps of:
a) filtering, based on using a non-linear stochastic equation as governing the motion of an object, the filtering responsive to an initial estimate of a state of motion of the object, and an initial value of state covariance, and further responsive to a succession of pluralities of measurements of the state, each plurality of measurements of the state corresponding to a different instant of time, so as to statistically determine a succession of state estimates; and
b) measuring, responsive to information provided at least in part by a cellular base station, for providing the succession of pluralities of measurements of the state;

wherein individual association probabilities, each corresponding to a respective state measurement from among the pluralities of state measurements at respective instants of time, are used for weighting innovations corresponding to each of the measurements in the pluralities of measurements of the state.

16. A method as in claim 15, further comprising the steps of:
   a) determining an additional association probability providing a value for the probability that none of the plurality of measurements is correct;
   b) combining into a combined measurement innovation each individual innovation using the association probabilities as weightings;
   c) providing an updated state and determining a covariance of the updated state based on the individual association probabilities, and the association probability for providing a value for the probability that none of the measurements is correct, and also the combined measurement innovation.

17. A method as in claim 15, wherein each measurement has a corresponding measurement innovation, wherein the association probability at a $k^{th}$ instant of time for a $j^{th}$ measurement out of $m(k)$ state measurements is represented by $\beta_j(k)$ and is given by $$\beta_j(k) = e_j(k)\left[b(k) + \sum_{i=1}^{m(k)} e_i(k)\right]^{-1}$$

for $j=1 \ldots m(k)$, where $$e_j(k) = P_G^{-1} N[\upsilon_j(k); 0, S(k)]$$

in which $P_G$ is a gate probability, $N\{\ \}$ denotes the normal distribution, $\upsilon_j(k)$ is the measurement innovation for the $j^{th}$ measurement, and $S(k)$ is an innovation covariance at instant k, given by $$S(k) = H(k)P(k|k-1)H^T(k) + R(k),$$

in which $H(k)$ relates actual state information to measured state information, $P(k|k-1)$ is an a priori estimate error covariance, and $R(k)$ is a measurement error covariance, and where $$b(k) = m(k)(1-P_DP_G)[P_DP_GV(k)]^{-1}$$

in which $V(k)$ is the volume of a validation region, and $P_D$ is a probability of detection; and further wherein the association probability providing a value for the probability that none of the plurality of measurements is correct is represented by $\beta_0(k)$ and is given by $$\beta_0(k) = b(k)\left[b(k) + \sum_{j=1}^{m(k)} e_j(k)\right]^{-1}.$$

18. A method as in claim 17, wherein the filtering is responsive to measurements provided by a measurement engine receiving information from both satellites and cellular base stations.

19. A method as in claim 15, wherein the filtering is responsive to a finite gate width γ of a validation region, and wherein the filter rejects a measurement from among the plurality of measurements all at a same instant of time if the measurement falls outside the validation region.

20. A method as in claim 19, wherein the validation region is defined by $$V(k+1,\gamma) = \{z(k+1):[z(k+1)-\hat{z}(k+1|k)]^T S^{-1}(k+1)[z(k+1)-\hat{z}(k+1|k)] \leq \gamma\}$$

for some predetermined value of the gate width γ, in which $\hat{z}(k+1|k)$ is a prediction of a next measurement, and $z(k+1)$ is the next measurement.

21. A method as in claim 20, wherein the filtering is responsive to measurements provided by a measurement engine receiving information from both satellites and cellular base stations.

22. A method as in claim 15, wherein the filtering is responsive to measurements provided by a measurement engine receiving information from both satellites and cellular base stations.

23. A method as in claim 15, wherein the filtering is as performed by an extended Kalman filter (EKF).

24. A method, comprising the steps of:
   a) filtering, based on using a non-linear stochastic equation as governing the motion of an object, the filtering responsive to an initial estimate of a state of motion, and an initial value of state covariance, and further responsive to a succession of pluralities of measurements of the state, each plurality of measurements of the state corresponding to a different instant of time, so as to statistically determine a succession of state estimates;
   b) measuring, responsive to information provided by positioning satellites, for providing the succession of pluralities of measurements of the state;
   c) determining association probabilities for a plurality of measurements of the state all at a same instant of time, each association probability corresponding to a respective state measurement at the instant of time, and also determining an association probability providing a value for the probability that none of the plurality of measurements is correct;
   d) combining into a combined measurement innovation each individual innovation using the association probabilities as weightings; and
   e) determining the covariance of the updated state based on the individual association probabilities, and the association probability for providing a value for the probability that none of the measurements is correct, and also the combined measurement innovation.

25. A method as in claim 24, wherein the filtering is as performed by an extended Kalman filter (EKF).

26. A positioning system filter, responsive to an initial estimate of a state of motion of an object, and an initial value of state covariance, and further responsive to a succession of pluralities of measurements of the state, each plurality of measurements of the state corresponding to a different instant of time, for statistically determining a succession of state estimates, wherein the filter is responsive to measurements provided by a measurement engine receiving at least some information from a cellular base station, and comprising means for determining individual association probabilities, each corresponding to a respective state measurement from among the pluralities of state measurements at respective instants of time, for weighting innovations corresponding to each of the measurements in the pluralities of measurements of the state.

27. A positioning system filter as in claim 26, further comprising:
   a) means for determining an additional association probability providing a value for the probability that none of the plurality of measurements is correct;

b) means for combining into a combined measurement innovation the individual innovations using the individual association probabilities as weightings; and c) means for providing an updated state and for determining a covariance of the updated state based on the individual association probabilities, and the association probability for providing a value for the probability that none of the measurements is correct, and also the combined measurement innovation.

28. A positioning system filter as in claim 26, wherein each measurement has a corresponding measurement innovation, wherein the means for determining the association probability at a $k^{th}$ instant of time for a $j^{th}$ measurement out of m(k) state measurements is represented by $\beta_j(k)$ and is given by $$\beta_j(k) = e_j(k)\left[b(k) + \sum_{i=1}^{m(k)} e_i(k)\right]^{-1}$$

for j=1 ... m(k), where $$e_j(k) = P_G^{-1} N[\upsilon_j(k); 0, S(k)]$$

in which $P_G$ is a gate probability, N{ } denotes the normal distribution, $\upsilon_j(k)$ is the measurement innovation for the $j^{th}$ measurement, and S(k) is an innovation covariance at instant k, given by $$S(k) = H(k)P(k|k-1)H^T(k) + R(k),$$

in which H(k) relates actual state information to measured state information, P(k|k−1) is an a priori estimate error covariance, and R(k) is a measurement error covariance, and where $$b(k) = m(k)(1 - P_D P_G)[P_D P_G V(k)]^{-1}$$

in which V(k) is the volume of a validation region, and $P_D$ is a probability of detection; and further wherein the means for determining an association probability providing a value for the probability that none of the plurality of measurements is correct is represented by $\beta_0(k)$ and is given by $$\beta_0(k) = b(k)\left[b(k) + \sum_{j=1}^{m(k)} e_j(k)\right]^{-1}.$$

29. A positioning system filter as in claim 28, wherein the filter is responsive to measurements provided by a measurement engine receiving information from both satellites and cellular base stations.

30. A positioning system filter as in claim 26, wherein the filter is responsive to a finite gate width γ of a validation region, and wherein the filter rejects a measurement from among the plurality of measurements all at a same instant of time if the measurement falls outside the validation region.

31. A positioning system filter as in claim 30, wherein the validation region is defined by $$V(k+1,\gamma) = \{z(k+1) : [z(k+1) - \hat{z}(k+1|k)]^T S^{-1}(k+1)[z(k+1) - \hat{z}(k+1|k)] \leq \}$$

for some predetermined value of the gate width γ, in which $\hat{z}(k+1|k)$ is a prediction of a next measurement, and z(k+1) is the next measurement.

32. A positioning system filter as in claim 31, wherein the filter is responsive to measurements provided by a measurement engine receiving information from both satellites and cellular base stations.

33. A positioning system filter as in claim 26, wherein the filter is responsive to measurements provided by a measurement engine receiving information from both satellites and cellular base stations.

34. A positioning system filter as in claim 26, wherein the filter is an extended Kalman filter (EKF).

35. A positioning system as in claim 1, wherein the filter is a non-linear filter.

36. A positioning system as in claim 1, wherein the filter is a linear filter.

37. A positioning system as in claim 12, wherein the filter is a non-linear filter.

38. A positioning system as in claim 12, wherein the filter is a linear filter.

39. A method as in claim 15, wherein the filtering is performed by a non-linear filter.

40. A method as in claim 15, wherein the filtering is performed by a linear filter.

41. A method as in claim 24, wherein the filtering is performed by a non-linear filter.

42. A method as in claim 24, wherein the filtering is performed by a linear filter.

43. A positioning system filter as in claim 26, wherein the filter is a non-linear filter.

44. A positioning system filter as in claim 26, wherein the filter is a linear filter.

45. A positioning system as in claim 1, wherein the positioning system is a global positioning system (GPS).

46. A positioning system as in claim 12, wherein the positioning system is a global positioning system (GPS).

* * * * *

UNITED STATES PATENT AND TRADEMARK OFFICE
CERTIFICATE OF CORRECTION

PATENT NO. : 6,535,833 B1
DATED : March 18, 2003
INVENTOR(S) : Jari Syrjärinne

It is certified that error appears in the above-identified patent and that said Letters Patent is hereby corrected as shown below:

Column 4,
Line 11, "particular as piece" should be -- particular piece --.

Column 6,
Line 56, Equation (7), the second "x" and the fourth "x" should be -- $\hat{x}$ --.

Column 7,
Line 9, Equation (10), "x" should be -- $\hat{x}$ --.

Column 9,
Line 25, Equation (25), the first "x" should be -- $\hat{x}$ --.

Line 67, "based on, infor-" should be -- based on infor- --.

Column 11,
Line 6, "equipment failures: including" should be -- equipment failures including --.
Line 8, "PG" should be -- $P_g$ --.
Line 43, "$\pi/3$" should be -- $4\pi/3$ --.

Column 12,
Line 58, "k)" should be -- k). --.

Column 13,
Line 34, "the, outputs" should be -- the outputs --.

Column 15,
Line 1, in Equation, "M(K)" should be -- m(k) --.
Line 57, in Equation, ":[z(k+1) k)]" should be -- :[z(k+1) - z(k+1 k)] --.

UNITED STATES PATENT AND TRADEMARK OFFICE
CERTIFICATE OF CORRECTION

PATENT NO.   : 6,535,833 B1
DATED        : March 18, 2003
INVENTOR(S)  : Jari Syrjärinne It is certified that error appears in the above-identified patent and that said Letters Patent is hereby corrected as shown below:

Column 20,
Line 9, at the end of Equation, "$\leqq$" should be -- $\leqq \gamma$ --.

Signed and Sealed this

Seventh Day of October, 2003

JAMES E. ROGAN
*Director of the United States Patent and Trademark Office*